United States Patent
Fischer et al.

(10) Patent No.: US 7,495,302 B2
(45) Date of Patent: Feb. 24, 2009

(54) MICROMECHANICAL COMPONENT HAVING A DIAPHRAGM

(75) Inventors: Frank Fischer, Gomaringen (DE); Hans Artmann, Böblingen-Dagersheim (DE); Lars Metzger, Moessingen-Belsen (DE); Arnim Hoechst, Tuebingen (DE); Julian Gonska, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 251 days.

(21) Appl. No.: 11/072,859

(22) Filed: Mar. 3, 2005

(65) Prior Publication Data

US 2005/0204821 A1 Sep. 22, 2005

(30) Foreign Application Priority Data

Mar. 3, 2004 (DE) ............... 10 2004 010 293
Feb. 7, 2005 (DE) ............... 10 2005 005 551

(51) Int. Cl.
*H01L 27/00* (2006.01)

(52) U.S. Cl. .................. 257/419; 438/53; 73/717; 361/283.4

(58) Field of Classification Search ............ 257/419; 438/53; 73/717; 361/283.4
See application file for complete search history.

(56) References Cited

U.S. PATENT DOCUMENTS 4,665,610 A * 5/1987 Barth ................ 438/53
5,520,051 A * 5/1996 Fujii et al. ................ 73/514.36
6,063,645 A * 5/2000 Tasi et al. ................ 438/50
6,546,804 B2 * 4/2003 Stemme et al. ................ 73/704
2003/0215974 A1 * 11/2003 Kawasaki et al. ................ 438/50

FOREIGN PATENT DOCUMENTS

DE 103 05 442 8/2004

* cited by examiner

*Primary Examiner*—Douglas M Menz
*Assistant Examiner*—Steven J. Fulk
(74) *Attorney, Agent, or Firm*—Kenyon & Kenyon LLP

(57) ABSTRACT

A micromechanical component having a diaphragm is provided, the structure of which effectively prevents the penetration of dirt particles into the cavity. A method for manufacturing such a component is also provided. The structure of the component is implemented in a layer structure which includes at least one first sacrificial layer and a layer system over the first sacrificial layer. A cavity is formed in the first sacrificial layer underneath the diaphragm. In the region of the diaphragm between the upper layer and the lower layer of the layer system situated directly above the first sacrificial layer, at least one access channel to the cavity is formed which has at least one opening in the upper layer and at least one opening in the lower layer, the opening in the upper layer and the opening in the lower layer being offset with respect to each other.

8 Claims, 19 Drawing Sheets

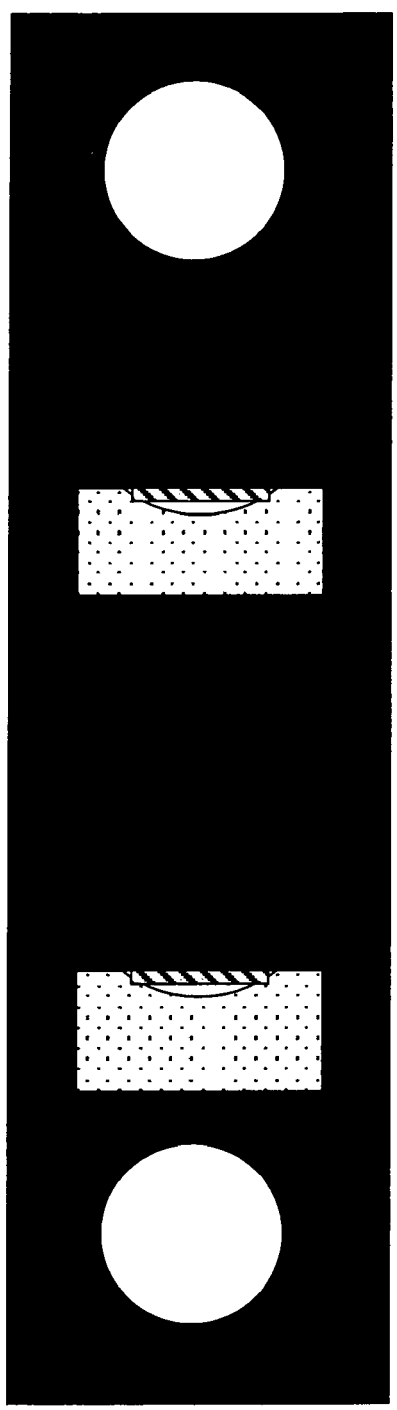
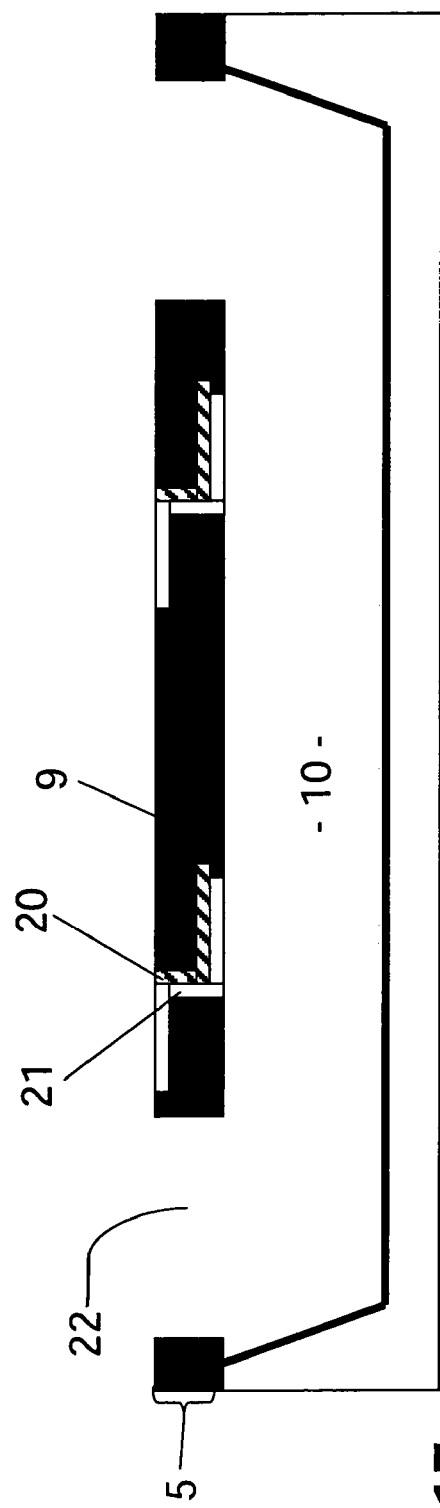
Fig. 17

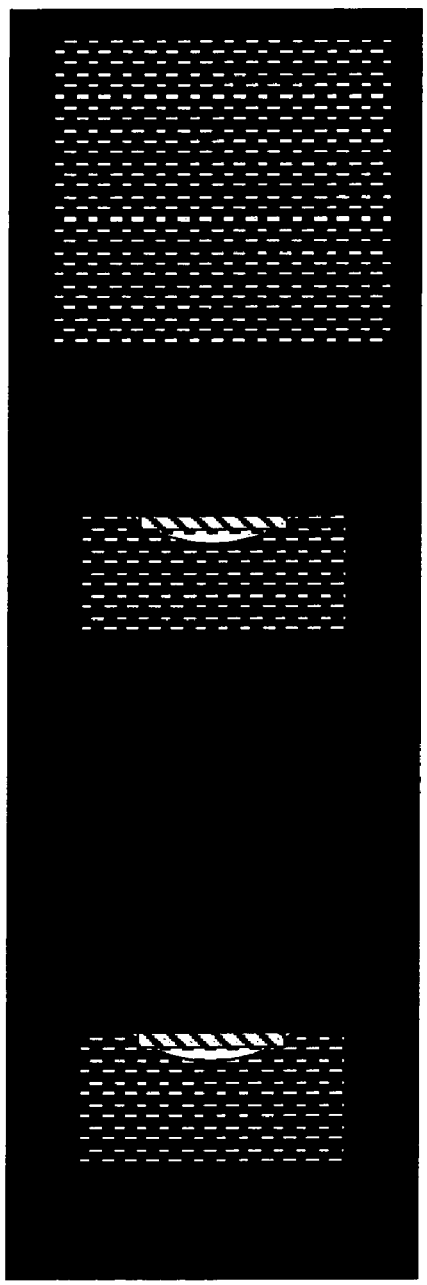
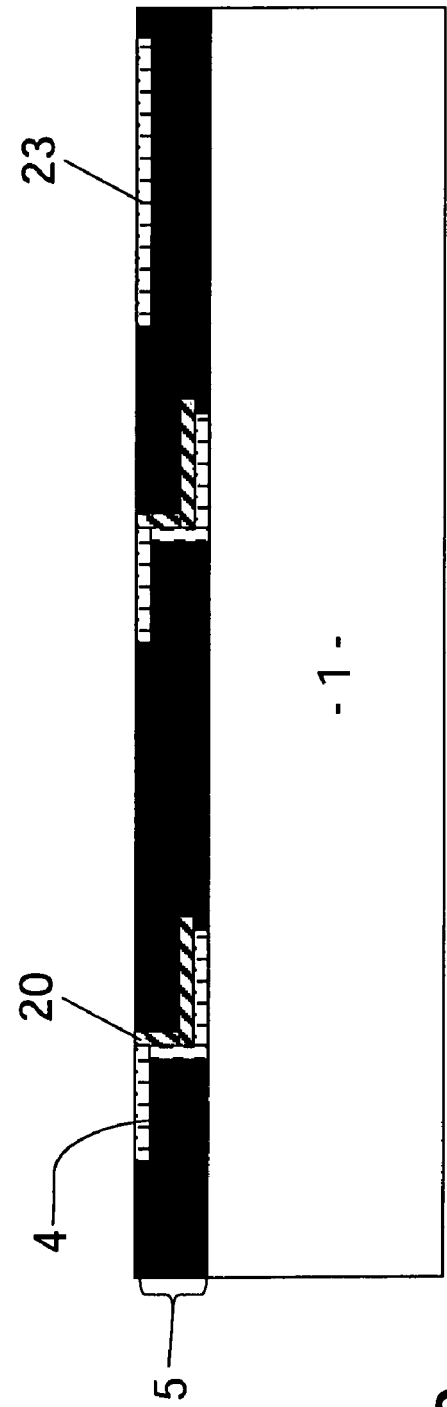
Fig. 19

MICROMECHANICAL COMPONENT HAVING A DIAPHRAGM

FIELD OF THE INVENTION

The present invention relates to a micromechanical component having at least one diaphragm, and to a method for manufacturing such a component. The component structure is implemented in a layer structure, which includes at least one first sacrificial layer and a layer system above the first sacrificial layer. In an etching step, the material of the first sacrificial layer is removed in the region beneath the diaphragm, thereby exposing the diaphragm and creating a cavity.

BACKGROUND INFORMATION

In practice, micromechanical components having a self-supporting diaphragm are used in the contexts of pressure sensors and thermal sensors such as mass flow sensors, thermal angle of inclination sensors, and thermal infrared detectors for example. In thermal sensors, the self-supporting diaphragm is used as a thermally insulated region having a low heat capacity.

German Patent Application No. 103 05 442, filed on Feb. 11, 2003, describes the manufacture of a micromechanical component having a self-supporting diaphragm, which includes multiple layers and is implemented in a pure front-side process. To this end, an appropriate layer system is first produced on the substrate of the component. To expose the diaphragm, orifices are then introduced into the layer system, which are oriented in essence perpendicularly to the layer planes and which completely penetrate the layer system, so that the orifices form an etching access path to the substrate. Starting at the front side, the substrate material in the region beneath the orifices is then removed in an isotropic etching step, it being possible to refer to the substrate down to the depth of the cavity thus created as a sacrificial layer.

The cavity formed beneath the diaphragm is in direct contact with the surroundings of the component via the etching access paths, so that dirt particles are able to penetrate the cavity unhindered and collect there. This generally has an adverse effect on the functionality of the component, and in extreme cases results in the total failure of the component.

German Patent Application No. 103 05 442 makes reference to the possibility of depositing a closing layer over the layer system after the diaphragm is exposed in order to close the etching access paths. In practice, however, this has proven to be problematic in several respects. Because the material of the closing layer grows on the diaphragm essentially in the vertical direction, the orifices in the diaphragm are closed only relatively slowly. This results in the formation of a relatively thick closing layer, which often adversely affects the mechanical as well as the thermal properties of the diaphragm. In addition, during production of the closing layer it is usually not possible to prevent the material of the closing layer from also depositing in the region of the cavity and in particular on the lower side of the diaphragm, which has an additional negative effect on the mechanical and thermal properties of the diaphragm. Finally, it should be noted that producing and processing a closing layer is associated with additional manufacturing expenditure.

SUMMARY OF THE INVENTION

The present invention provides a micromechanical component having a diaphragm, the structure of which effectively prevents dirt particles from penetrating the cavity. This is achieved by the present invention in that in the region of the diaphragm between the upper layer and the lower layer situated directly above the cavity the first sacrificial layer at least one access channel to the cavity is formed which has at least one opening in the upper layer and at least one opening in the lower layer, the opening in the upper layer and the opening in the lower layer being offset with respect to each other.

The present invention further provides a method for manufacturing such a component. Accordingly, above the first sacrificial layer, at least one first lower layer of the layer system is formed and structured, at least one opening to the first sacrificial layer being thereby created. Above the structured lower layer, at least one second sacrificial layer is then formed and structured, so that at least one region of the second sacrificial layer follows the opening in the lower layer. Above the structured second sacrificial layer, at least one upper layer of the layer system is formed and structured and/or thinned, at least one opening to the second sacrificial layer being produced. It is important for the opening in the upper layer to be offset with respect to the opening in the lower layer, so that both openings are joined via a connected region in the second sacrificial layer. Subsequently, the material of the second sacrificial layer is removed, at least in the connected region, in an etching step, at least one access channel to the first sacrificial layer being produced between the opening in the upper layer and the opening in the lower layer of the layer system. The material in the first sacrificial layer is then removed through this access channel, likewise by etching.

First, it was recognized that the etching access paths need not necessarily be closed in order to prevent dirt particles from penetrating the cavity below the diaphragm. It was also recognized that the etching access paths need not necessarily run vertically through the diaphragm. Since the diaphragm is exposed in an etching process using a liquid or gaseous etching medium, any channel, no matter what its shape, that provides a connection to the sacrificial layer situated below the diaphragm may be used as an etching access path. Starting from this, the present invention provides an access channel in the layer structure of the diaphragm, the openings in the access channel being offset with respect to each other so that a liquid or gaseous medium may readily pass through the access channel while the penetration of particles is prevented. Such an access channel may be readily produced using customary and hence very manageable processing steps from the field of micromechanics.

In principle there are various possibilities for implementing the component of the present invention or the method of its manufacture.

In an advantageous specific embodiment of the present invention, the opening in the upper layer and the opening in the lower layer are not arranged in an overlapping manner. In this case, the access channel has an offset such that particles are not able to enter the cavity below the diaphragm unimpeded.

In another advantageous specific embodiment of the present invention, the access channel or the flow path is rectilinear. In this case, particles are prevented from penetrating the cavity underneath the membrane by the fact that the diameter of the access channel is smaller than the expected particle diameter of approximately 200 nm. To implement such narrow access channels, the present invention provides for an overlapping arrangement of the openings in the upper layer and in the lower layer. In this case, the degree of overlap of the two openings and the layer thickness of the second sacrificial layer, that is, particularly the layer thickness in the edge region of the opening in the lower layer, determine the cross section of the access channel. Advantageously, the degree of overlap is chosen to be in the order of magnitude of the layer thickness of the second sacrificial layer, which under the resolution of photolithographic methods lies in the area of 200 nm.

In one advantageous embodiment, the access channels to the cavity that are formed in the diaphragm are closed off. Using an appropriate management of the method, a defined pressure, for example in the range between vacuum and atmospheric pressure, may thus be established in the cavity, which is advantageous for certain applications. The access channels may be readily closed by a closing layer that is formed over the layer system of the diaphragm. Due to the offset of the openings of the access channels according to the present invention, a reliable closure can be achieved already by a relatively thin closing layer. The closing layer therefore has only a negligible effect on the mechanical and thermal properties of the diaphragm. The offset of the openings of the access channel according to the present invention also prevents the material of the closing layer from penetrating the cavity underneath the diaphragm and accumulating there.

As previously mentioned, the location and geometry of the access channels in the diaphragm are defined with the aid of a second sacrificial layer which is formed and structured above the lower layer of the layer system. Only after the upper layer of the layer system is formed above the structured second sacrificial layer is the remaining material in the second sacrificial layer removed, thus producing the access channels. In a particularly advantageous variant of the method according to the present invention, the access channels in the diaphragm and the cavity underneath the diaphragm are produced in a joint etching step, in which first the material of the second sacrificial layer and then also the material of the first sacrificial layer are removed. In this connection, it proves advantageous to form the first and the second sacrificial layers from the same materials. At least an etching medium must be used which attacks both materials.

In an advantageous embodiment of the present invention, the component structure is implemented in a layer structure including a layer made of amorphous, polycrystalline, or monocrystalline silicon, silicon-germanium, or germanium as the first sacrificial layer. In this instance, the layer system of the diaphragm includes $SiO_2$ and/or $Si_3N_4$ layers as the upper and lower layer. These dielectric materials on the one hand have advantageous thermal material properties, so that the diaphragm may be used for the thermal decoupling of thermal and IR detectors, or for heating elements. On the other hand, no additional electrical insulation is required here if sensors and printed conductors are to be situated on the diaphragm, so that such a diaphragm component may be used effectively in the context of thermopiles, heaters, mass flow sensors, but also of pressure sensors. In this case, plasmaless fluorine-containing gas etching mixtures containing interhalides such as $ClF_3$, $BrF_3$, or $ClF_5$, and/or containing noble gas halides such as $XeF_2$, are suitable etching media for exposing the diaphragm and, if necessary, also for producing the access channels in the diaphragm, since these materials have a high selectivity with respect to silicon oxide and silicon nitride.

At this point it should also be noted that the production of access channels in the diaphragm that have an offset, as well as the closure of such access channels, may readily be integrated into a CMOS process sequence, so that the required method steps may also be readily integrated into manufacturing methods for numerous components such as thermopiles, heaters, pressure sensors etc.

BRIEF DESCRIPTION OF THE DRAWINGS

FIGS. 13 through 19 show the individual process steps for manufacturing additional micromechanical components of the present invention having a diaphragm, the upper part of the figures showing in each case a top view and the lower part a sectional view of the layer structure at the respective manufacturing stage.

DETAILED DESCRIPTION

Figure 1:
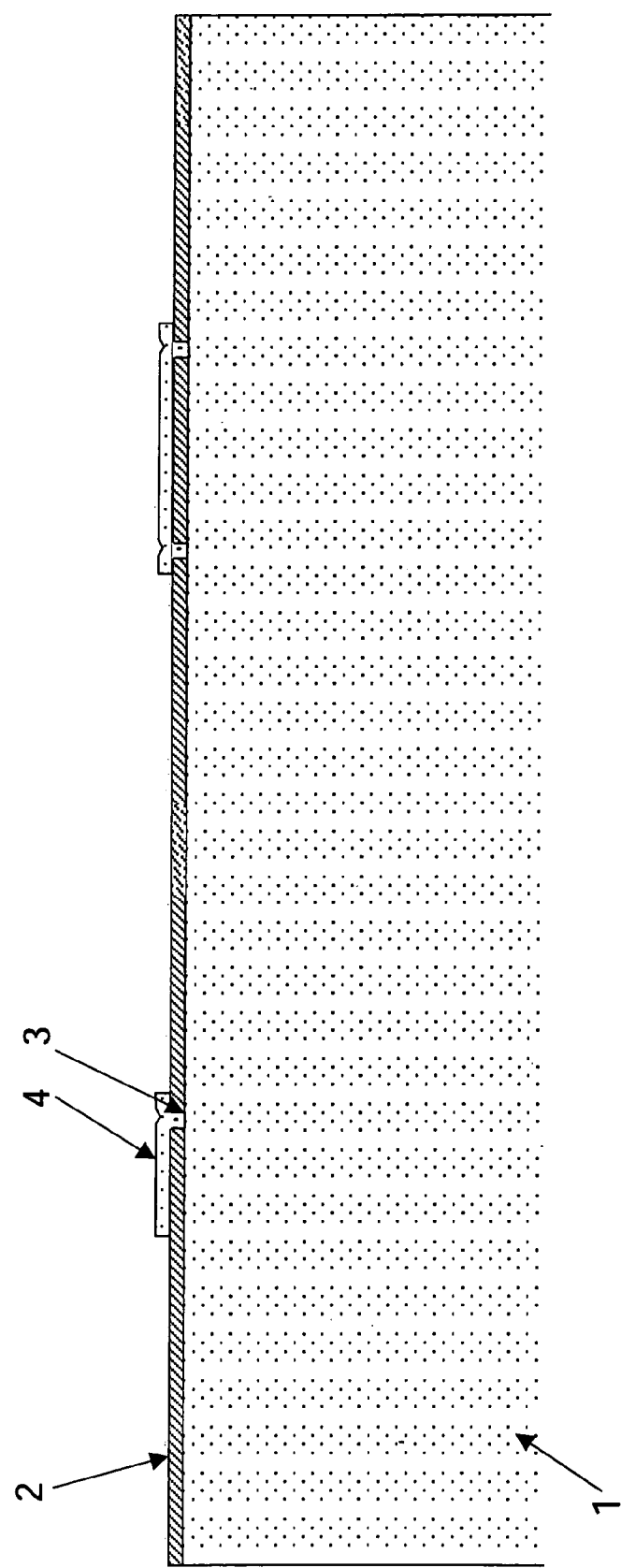
FIGS. 1 through 5 show the individual process steps for manufacturing a micromechanical component according to the present invention having a diaphragm.

The method variant illustrated in FIGS. 1 through 5 for manufacturing a micromechanical component having a diaphragm starts out from a substrate 1 made of monocrystalline or polycrystalline silicon, which in the exemplary embodiment illustrated here functions as a first sacrificial layer. At least one layer 2 made of a dielectric material such as silicon oxide, silicon nitride, or a combination of these materials, for example, is deposited on this substrate 1. Subsequently, layer 2 is structured, multiple openings 3 being created which are later to be used as a lower etching access path for exposing the diaphragm or diaphragms. A second sacrificial layer 4, which in the exemplary embodiment described here is also made of silicon, silicon-germanium, or germanium, is deposited over structured layer 2. These materials may be removed by the same plasmaless etching medium as the substrate material, for example by chlorine trifluoride. The layer thickness of second sacrificial layer 4 is between 50 nm and 2 µm. FIG. 1 shows the layer structure of the component after second sacrificial layer 4 has been structured and thereby removed again as much as possible. According to the present invention, each of the openings 3 in lower layer 2 is followed by a region of structured second sacrificial layer 4.

Figure 2:
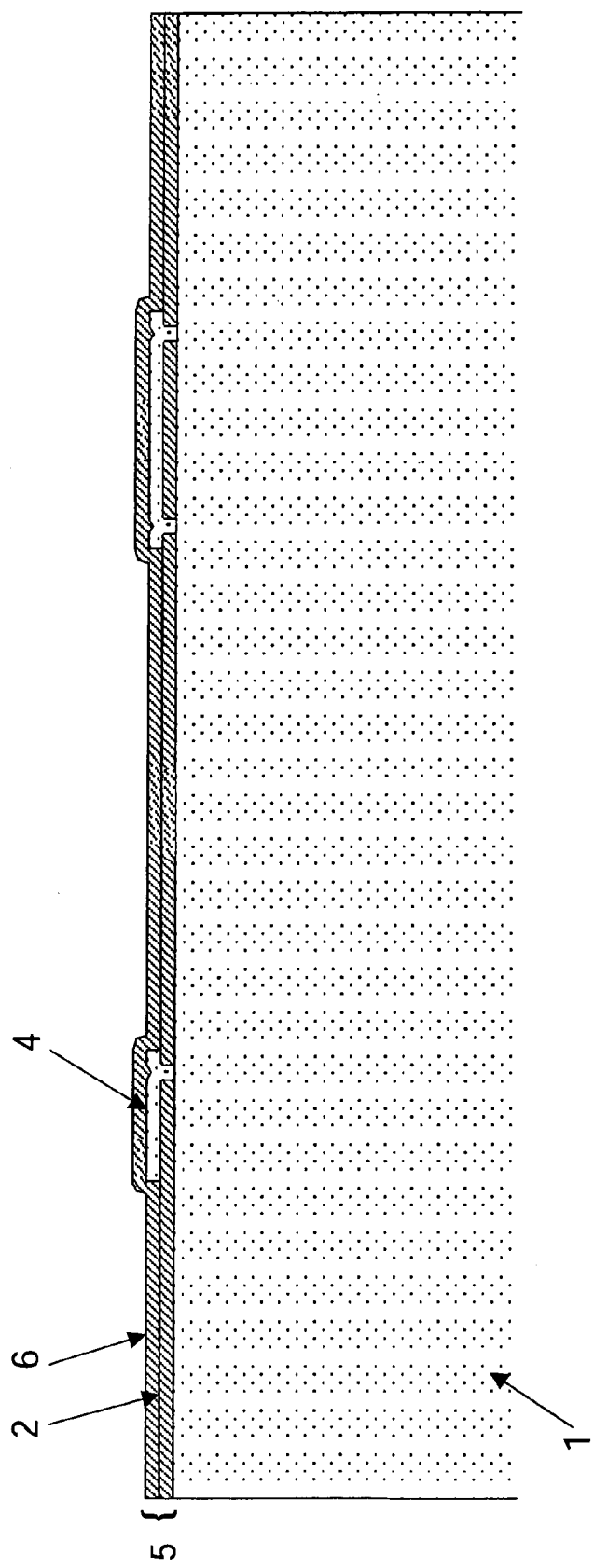

At least one upper layer 6 made of a dielectric material, such as silicon oxide, silicon nitride, or a combination of these materials, is deposited over structured second sacrificial layer 4, as illustrated in FIG. 2. Layer system 5, composed of layers 2 and 6, forms the main component of the diaphragm or diaphragms to be produced and is accordingly designed in such a way that its thermal properties and its mechanical properties such as stress ratios, for example, are optimized.

Figure 3:
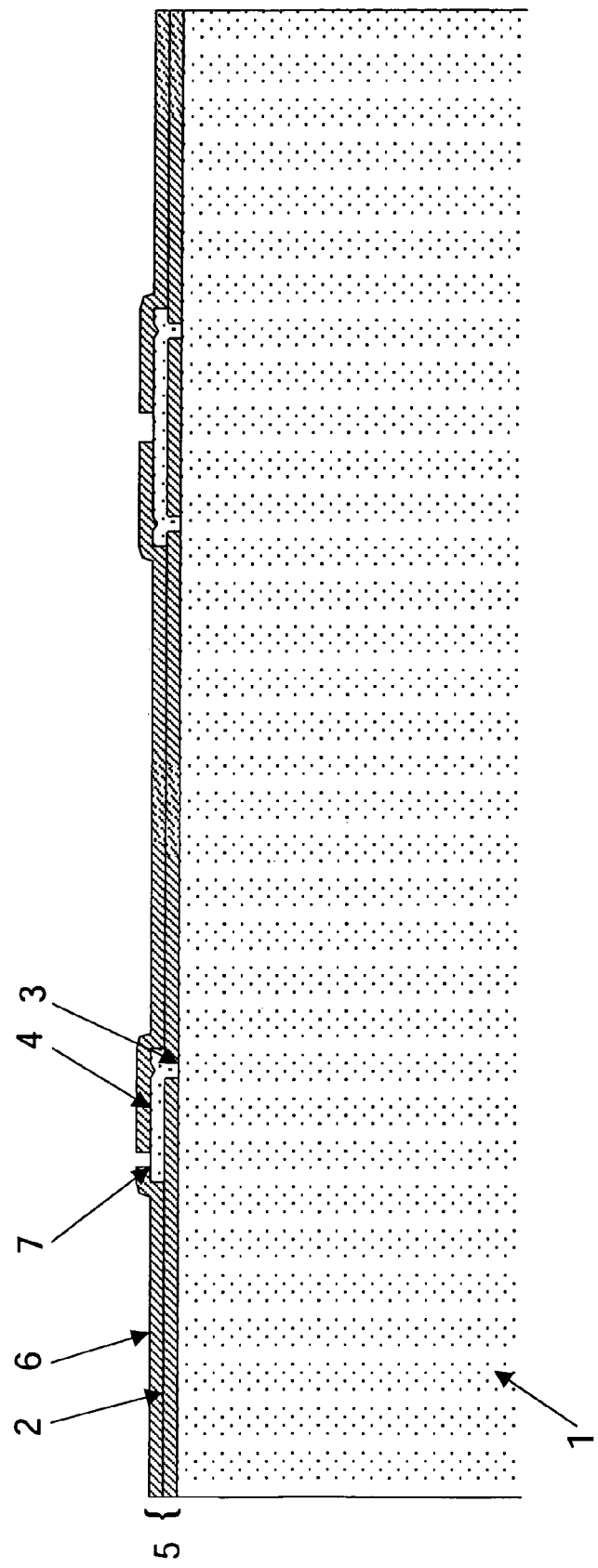

FIG. 3 shows the layer structure of the component after upper layer 6 has been structured. Multiple openings 7 are thus created that are intended to form the upper etching access path for exposing the diaphragms. According to the present invention, openings 7 in upper layer 6 are situated in such a way that they are joined to at least one opening 3 in lower layer 2 via a connecting region in second sacrificial layer 4, but are offset with respect to this opening 3 in lower layer 2.

Figure 4:
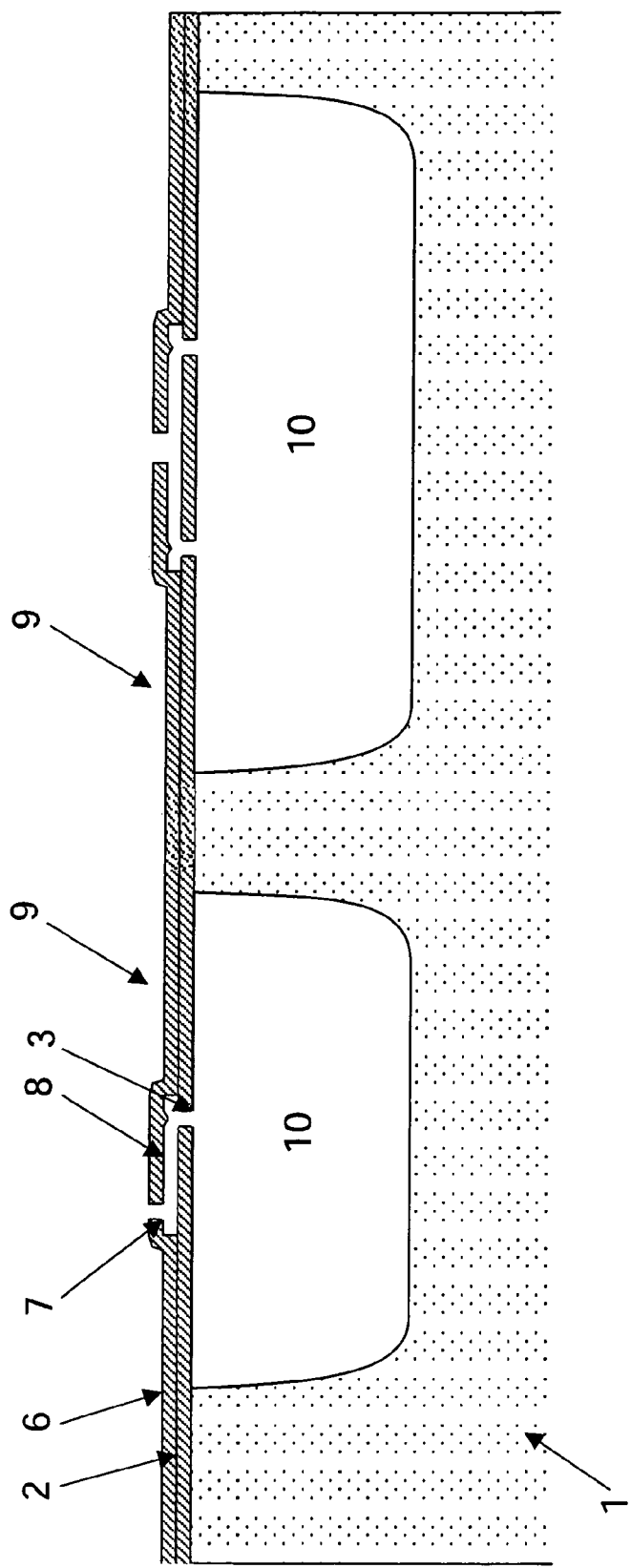

In this instance, a plasmaless etching medium is used in the subsequent etching step which has a very high selectivity with respect to silicon oxide and silicon nitride, such as chlorine trifluoride, for example. In this etching attack, first the material of second sacrificial layer 4 is removed via openings 7 in upper layer 6. Access channels 8 are thus created which open out into corresponding openings 3 in lower layer 2 of layer system 5. The etching medium then attacks the substrate material via these access channels 8, cavities 10 in substrate 1 being created and diaphragms 9 in layer system 5 above substrate 1 being exposed, as shown in FIG. 4. This figure clearly shows that cavities 10 are indeed connected to the surroundings via access channels 8, thus enabling gaseous and liquid media to enter and exit cavities 10. However, the offset of access channels 8 according to the present invention prevents particles from penetrating cavities 10.

Figure 5:
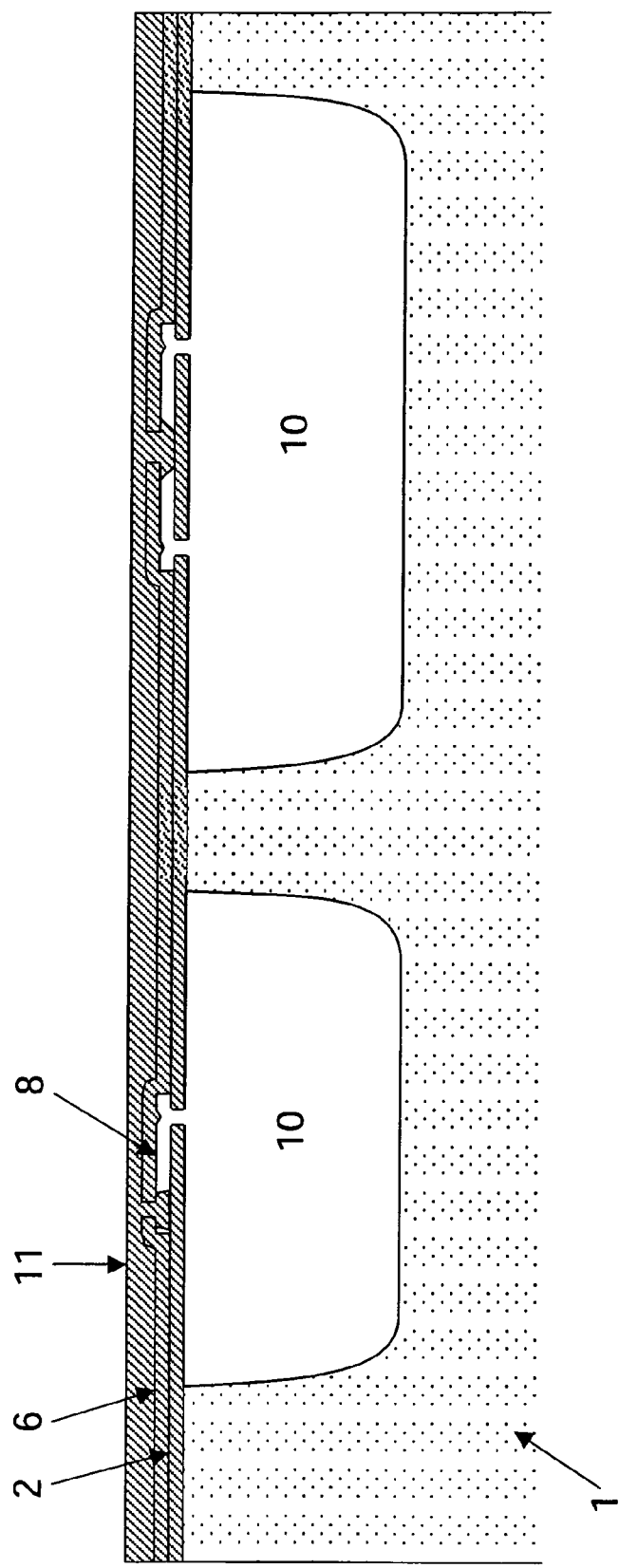

In the exemplary embodiment described here, a closing layer 11 or a corresponding layer sequence is deposited over layer system 5, which in this instance is also composed of silicon oxide, silicon nitride or a combination of these materials. The material of closing layer 11 grows not only on upper layer 6, but also—through openings 7—on lower layer 2. In this manner, the access paths to cavities 10 are closed off relatively quickly without the material of closing layer 11 penetrating cavities 10, as illustrated by FIG. 5. Because of the offset between openings 7 in the upper layer and corresponding openings 3 in lower layer 2, a secure closure of cavities 10 may already be achieved by a relatively thin closing layer 11.

Figure 6:
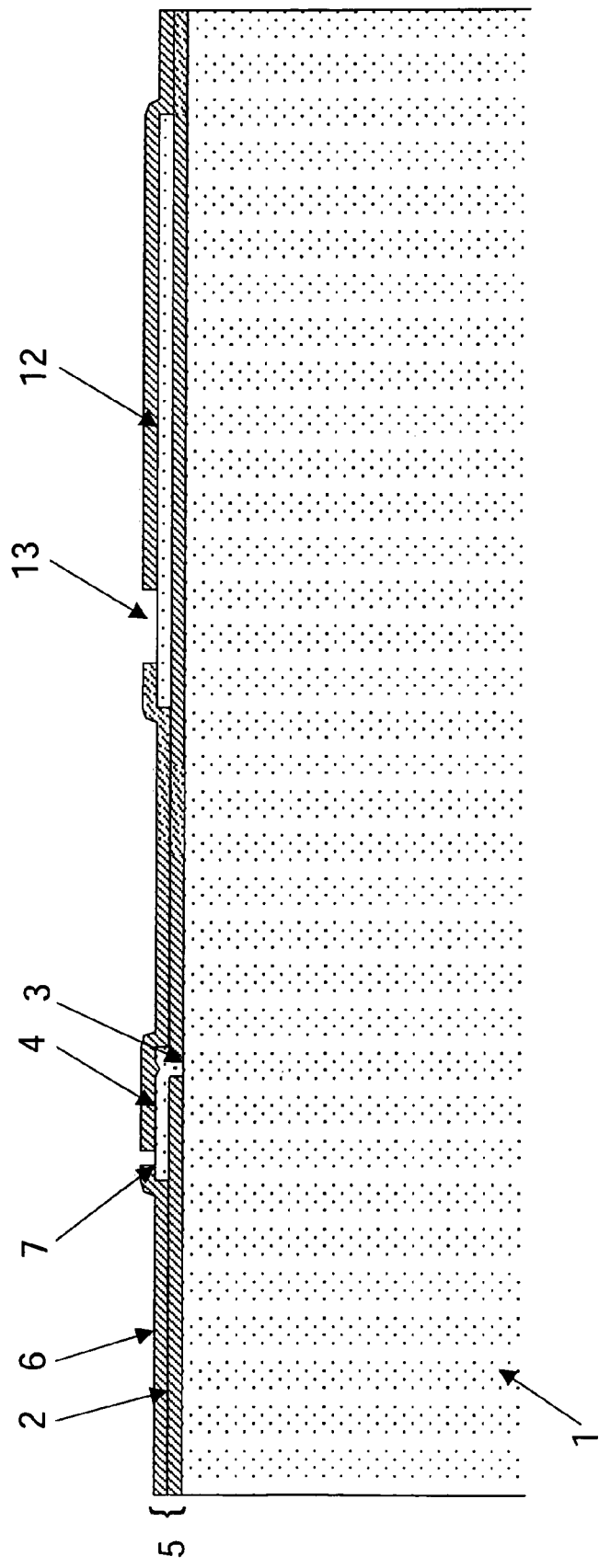
FIGS. 6 through 9 show the individual process steps for manufacturing a micromechanical component according to the present invention having a diaphragm and a first variant of a thermopile.
Figure 7:
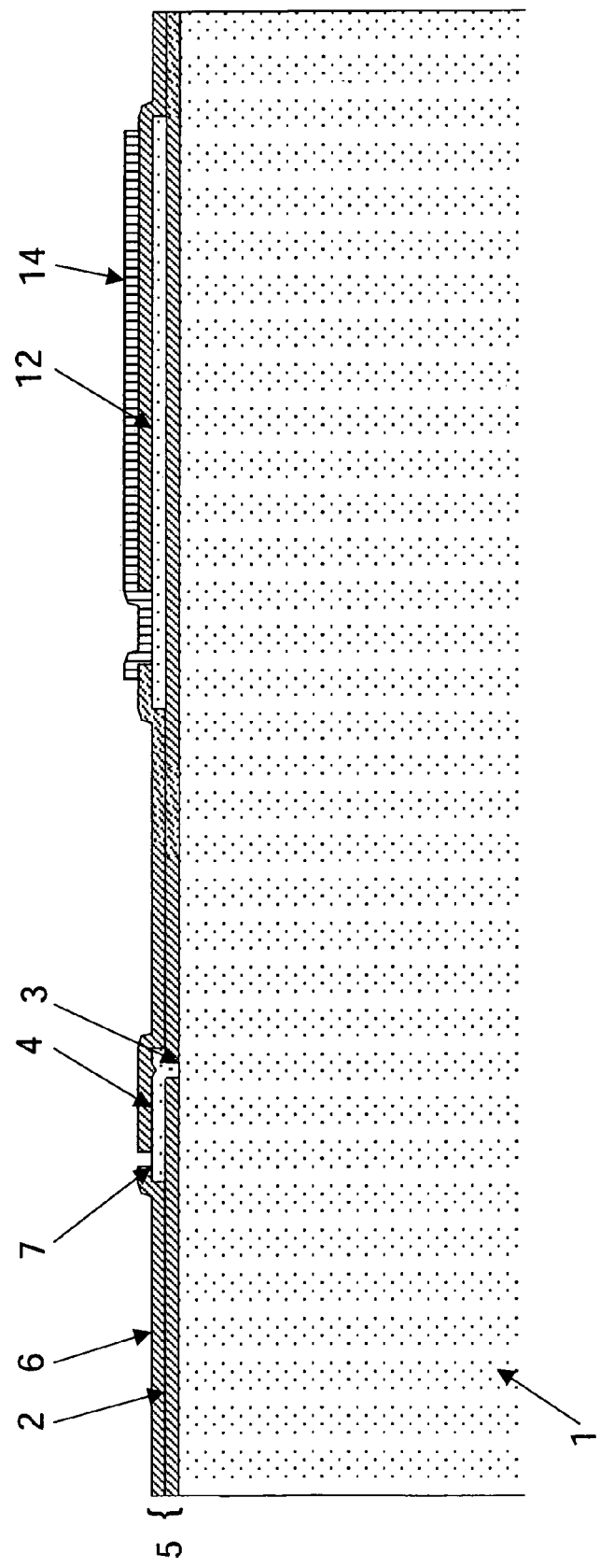

The method variant illustrated in FIGS. 6 through 9 for manufacturing a micromechanical component having a diaphragm and a thermopile likewise starts out from a substrate 1 made of monocrystalline or polycrystalline silicon, which in the exemplary embodiment illustrated here functions as a first sacrificial layer. As in the exemplary embodiment illustrated in FIGS. 1 through 5, a layer 2 made of a dielectric material such as silicon oxide, silicon nitride, for example, or a combination of these materials, is deposited on substrate 1. Layer 2 is subsequently structured. In this case, however, only one opening 3 is created, which is later to be used as a lower etching access path for exposing the diaphragm. A layer made of silicon, silicon-germanium, or germanium is deposited over layer 2 thus structured and is structured in such a way that only two regions 4 and 12 of this layer remain. Layer region 4 follows opening 3 in lower layer 2 and functions as a second sacrificial layer. Layer region 12 forms the first leg of a thermopile. An upper layer 6 made of a dielectric material such as silicon oxide, silicon nitride, or a combination of these materials is deposited over layer region 12. FIG. 6 shows the layer structure of the component after structuring of this upper layer 6. An opening 7 was thus created which is to form the upper etching access path for exposing the diaphragm. According to the present invention, opening 7 is situated in upper layer 6 in such a way that it is connected to opening 3 in lower layer 2 via layer region 4, but is offset with respect to opening 3 in lower layer 2. In addition to opening 7, an additional opening 13 is created, which is to form the contact region between the first and second leg of the thermopile. FIG. 7 shows the layer structure of the component after second leg 14 of the thermopile has been deposited and structured. The second leg extends over the entire contact region, thereby closing off opening 13 in upper layer 6. In the exemplary embodiment illustrated here, second leg 14 is produced from aluminum, which is not attacked in the subsequent etching step for exposing the diaphragm.

As in the exemplary embodiment explained in conjunction with FIGS. 1 through 5, an etching medium is used which has a high selectivity with respect to the materials of upper layer 6 and lower layer 2. The etching medium therefore penetrates opening 7 in the upper layer and attacks only the material of layer region 4. This initially produces an access channel 8 to substrate 1, through which subsequently the substrate material is also removed and a cavity 10 is created or diaphragm 9 is exposed, as illustrated in FIG. 8.

Figure 9:
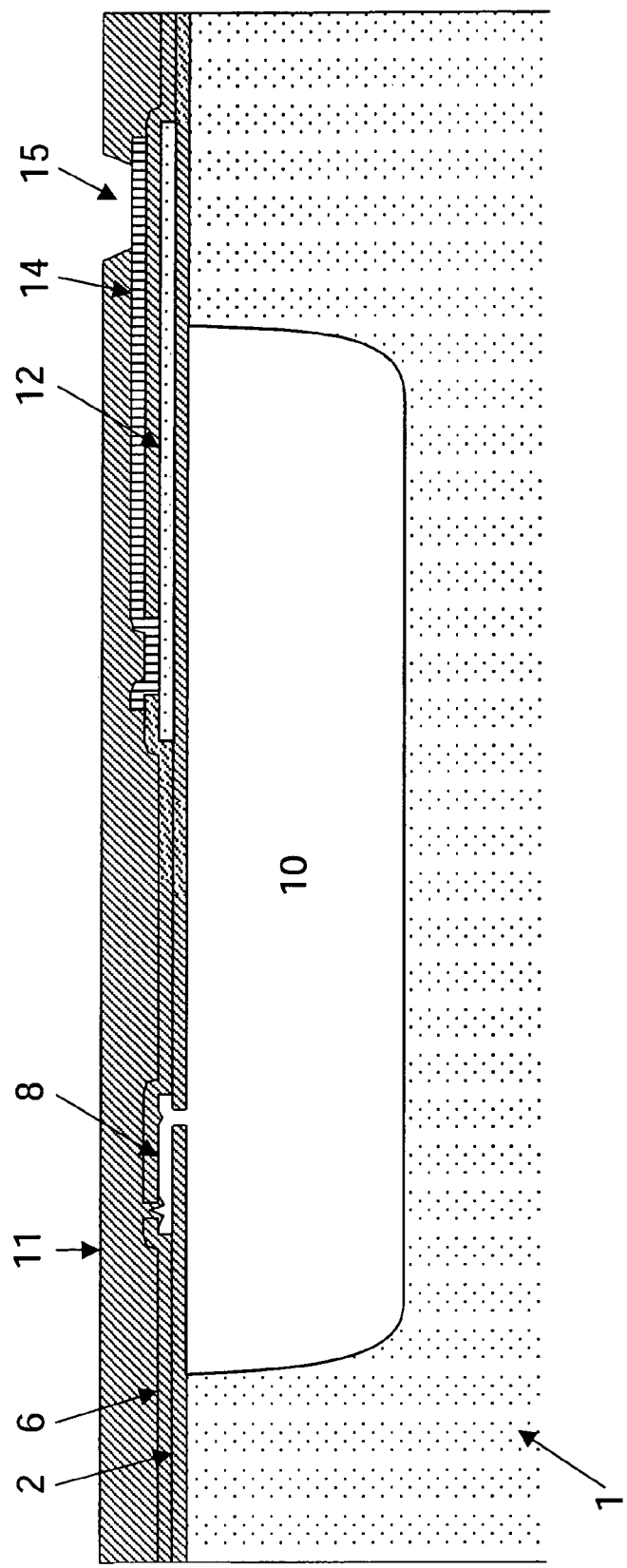

In this case as well, a closing layer 11 or a corresponding layer sequence is deposited over diaphragm 9 and the thermopile. A closed surface is thus produced upon which further processing, for example lithography, is possible. FIG. 9 shows the layer structure of the component by which an opening 15 for the bondlands of the thermopile is created in closing layer 11.

Figure 10:
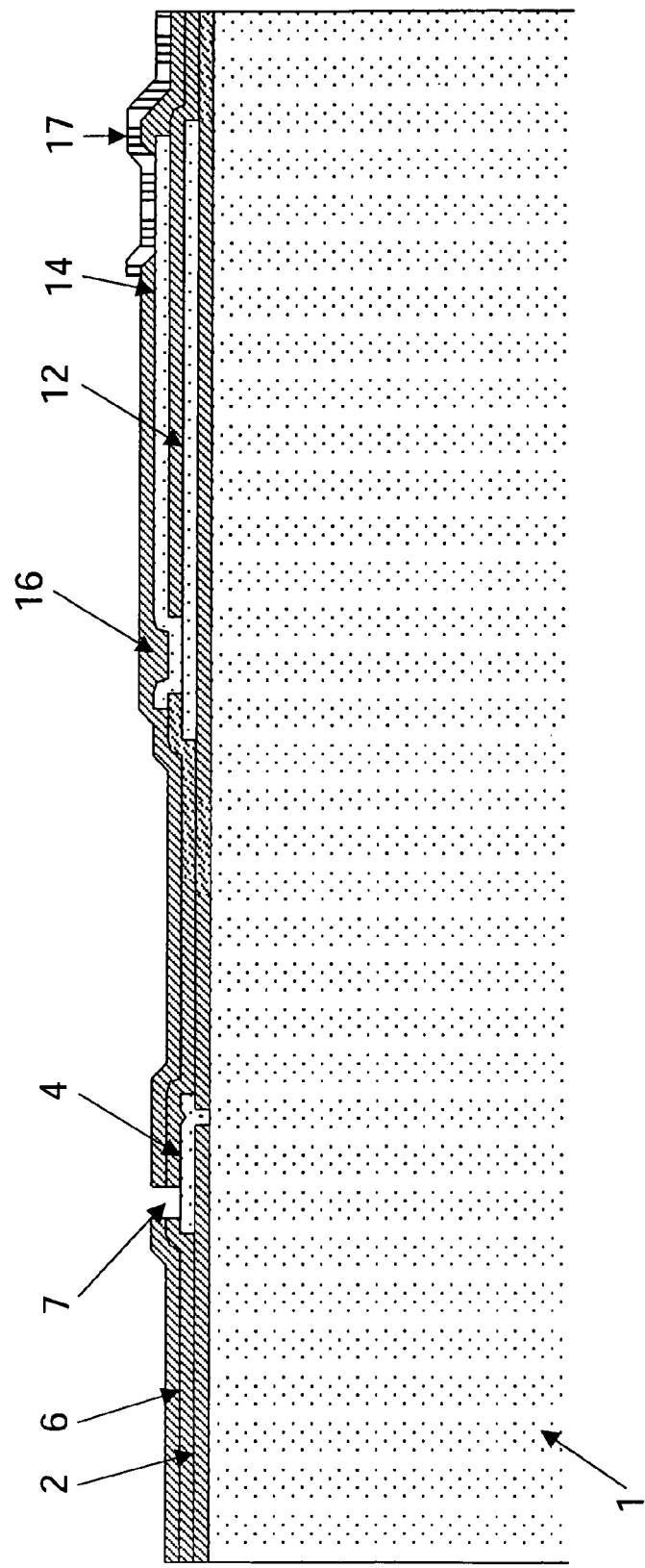
FIGS. 10 through 12 show the individual process steps for manufacturing a micromechanical component according to the present invention having a diaphragm and a second variant of a thermopile.
Figure 11:
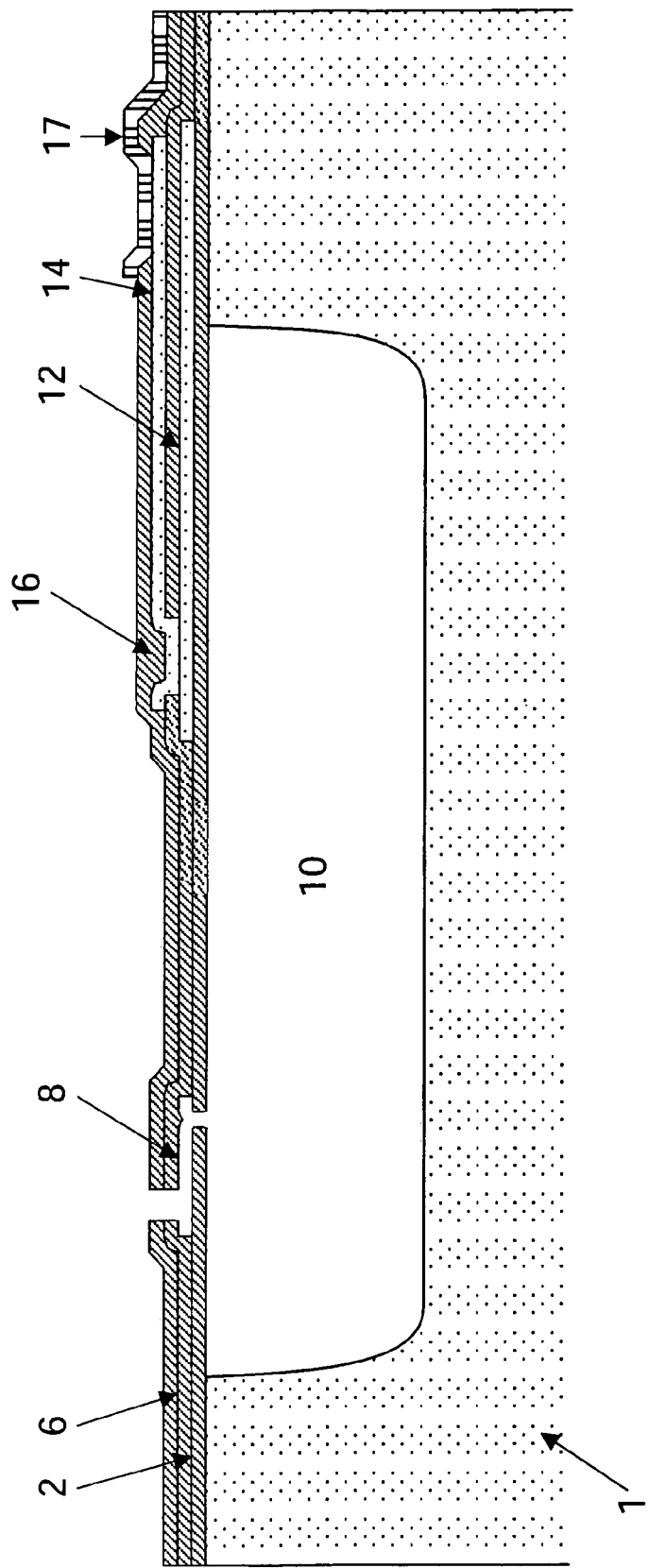
Figure 12:
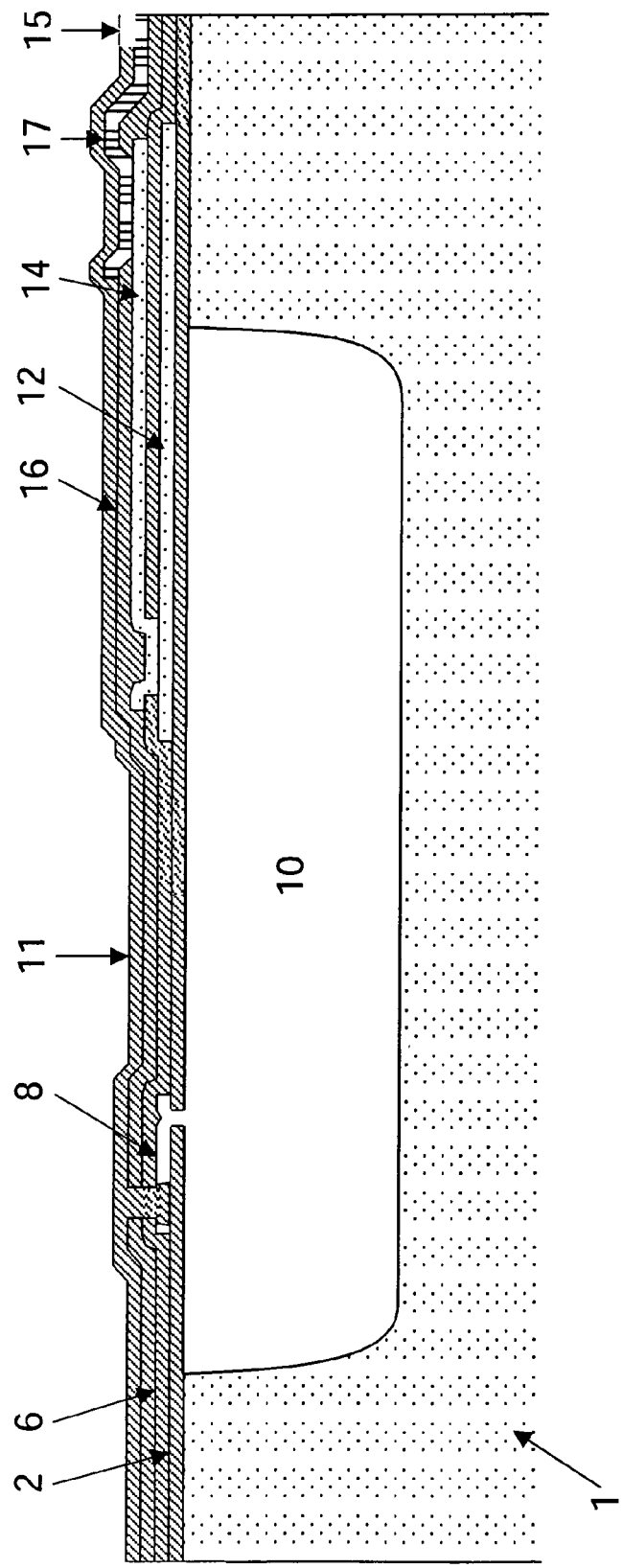

In the variant illustrated in FIGS. 10 through 12, second leg 14 of the thermopile is made of polysilicon. To prevent this structure from being attacked when the diaphragm is exposed, a passivating layer 16 is created and structured over layer system 5 and second leg 14 of the thermopile. Again, an oxide and/or a nitride, which is/are not attacked by the etching medium used to expose the diaphragm, may be considered as materials for passivating layer 16. Passivating layer 16 is opened in the region of opening 7 in the upper layer to obtain the upper etching access path. In addition, a contact orifice for electrical contacting of second leg 14 of the thermopile is created. In a further process step, this contact hole is closed again with the aid of a metal track 17, as shown in FIG. 10.

Figure 8:
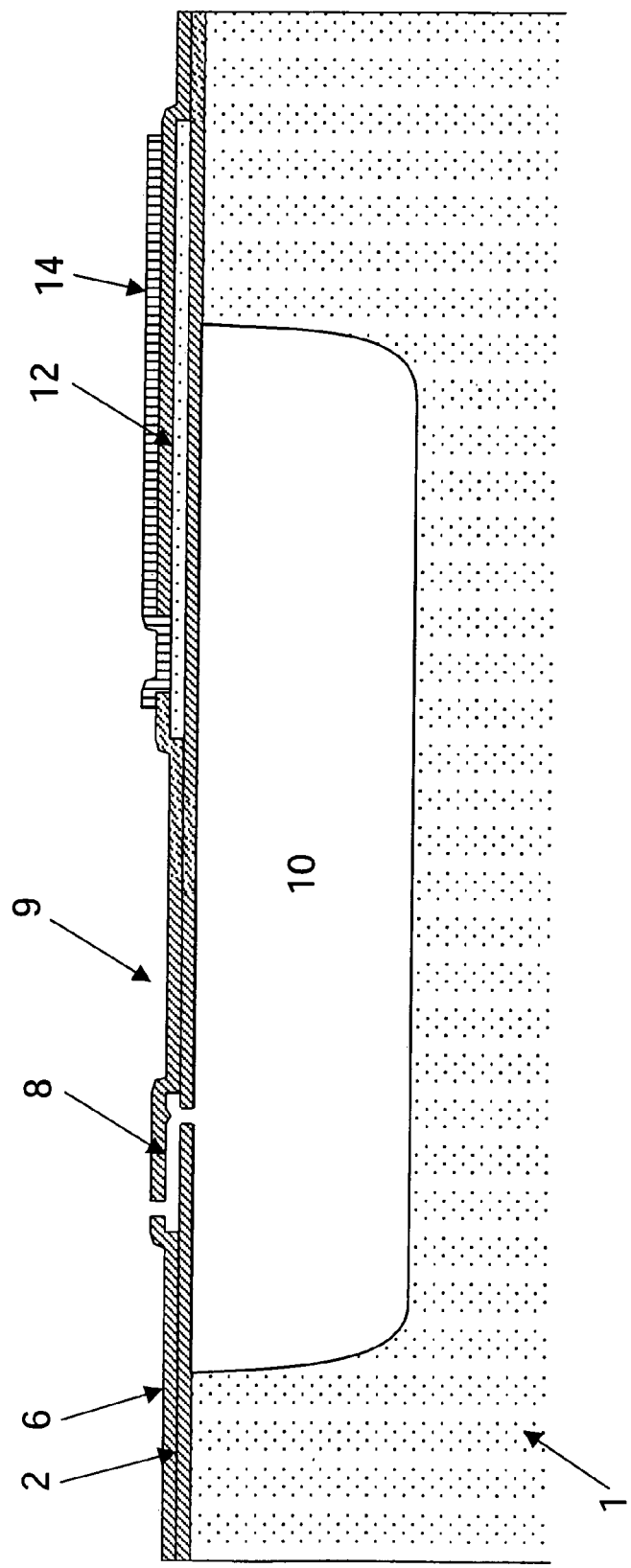

FIG. 11 shows the layer structure of the component after diaphragm 9 has been exposed in an etching step, as described in conjunction with FIGS. 4 and 8, and FIG. 12 shows the component after a closing layer 11 has been applied, as previously described in conjunction with FIGS. 5 and 9.

As in the exemplary embodiments described above, the method variant, represented in FIGS. 13 through 19, for manufacturing a micromechanical component having a diaphragm also starts out from a substrate 1 made of monocrystalline or polycrystalline silicon, which functions as a first sacrificial layer. On this substrate 1, at least one layer 2 made of a dielectric material—such as, for example, silicon oxide, silicon nitride or a combination of these materials—is deposited or perhaps also a layer system, which later forms a part of the exposed diaphragm and which may include functional circuit traces made of silicon, metals, etc. as well as additional layers. Subsequently, layer 2 is structured, multiple openings 3 being created which are later to be used as a lower etching access path for exposing the diaphragm or diaphragms. A second sacrificial layer 4, which in the exemplary embodiment described here is also composed of silicon, silicon-germanium, or germanium, is deposited over structured layer 2. These materials may be removed by the same plasmaless etching medium as the substrate material, for example by chlorine trifluoride. The layer thickness of second sacrificial layer 4 is between 50 nm and 2 μm.

Figure 13:
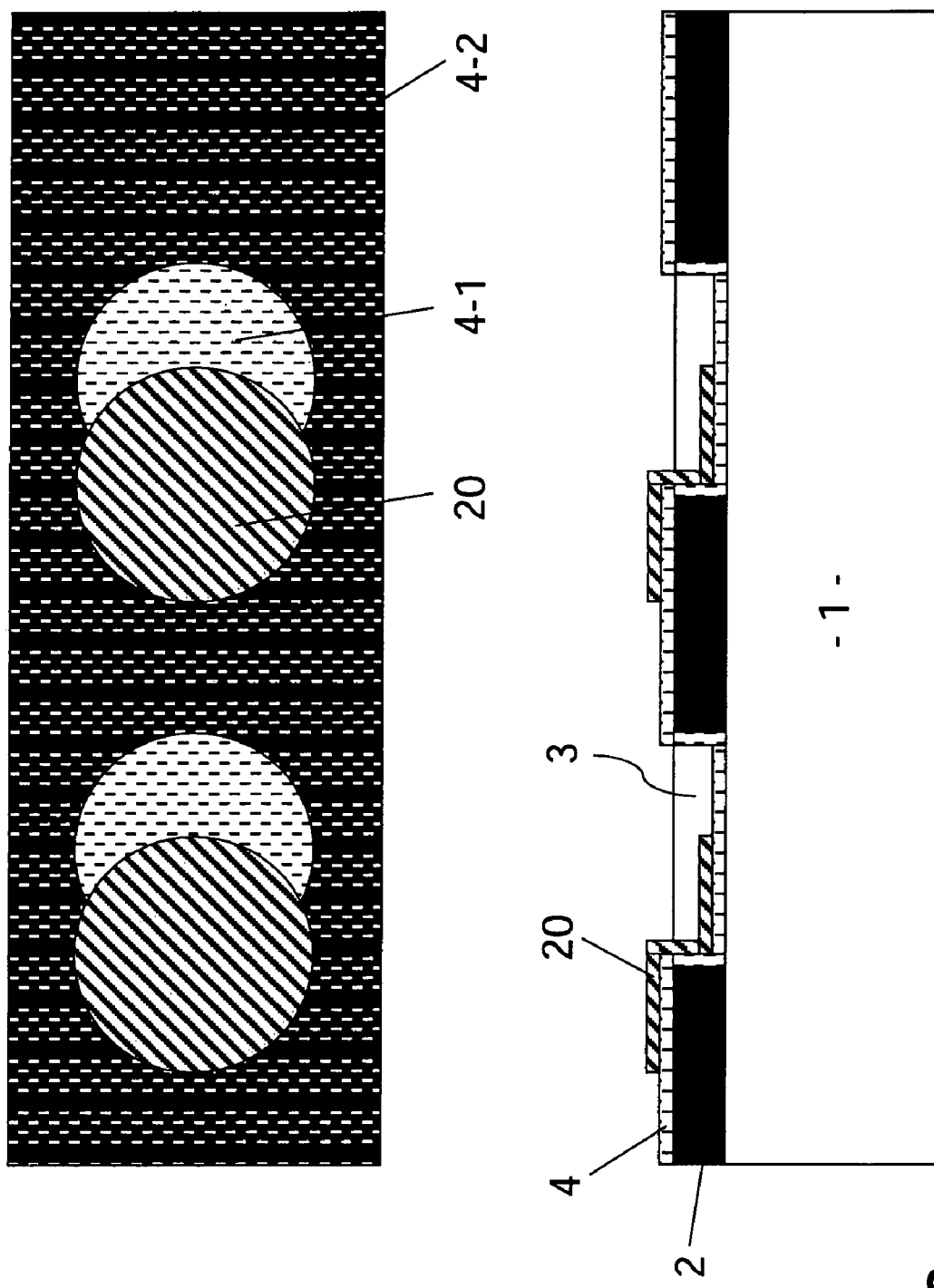

FIG. 13 shows the layer structure of the component after a passivating layer 20, made of nitride for example, has been consistently applied on second sacrificial layer 4 and has been structured using conventional technology. The top view of the surface of the layer structure makes it clear that the remaining regions of passivating layer 20 and openings 3 overlap in lower layer 2.

Figure 14:
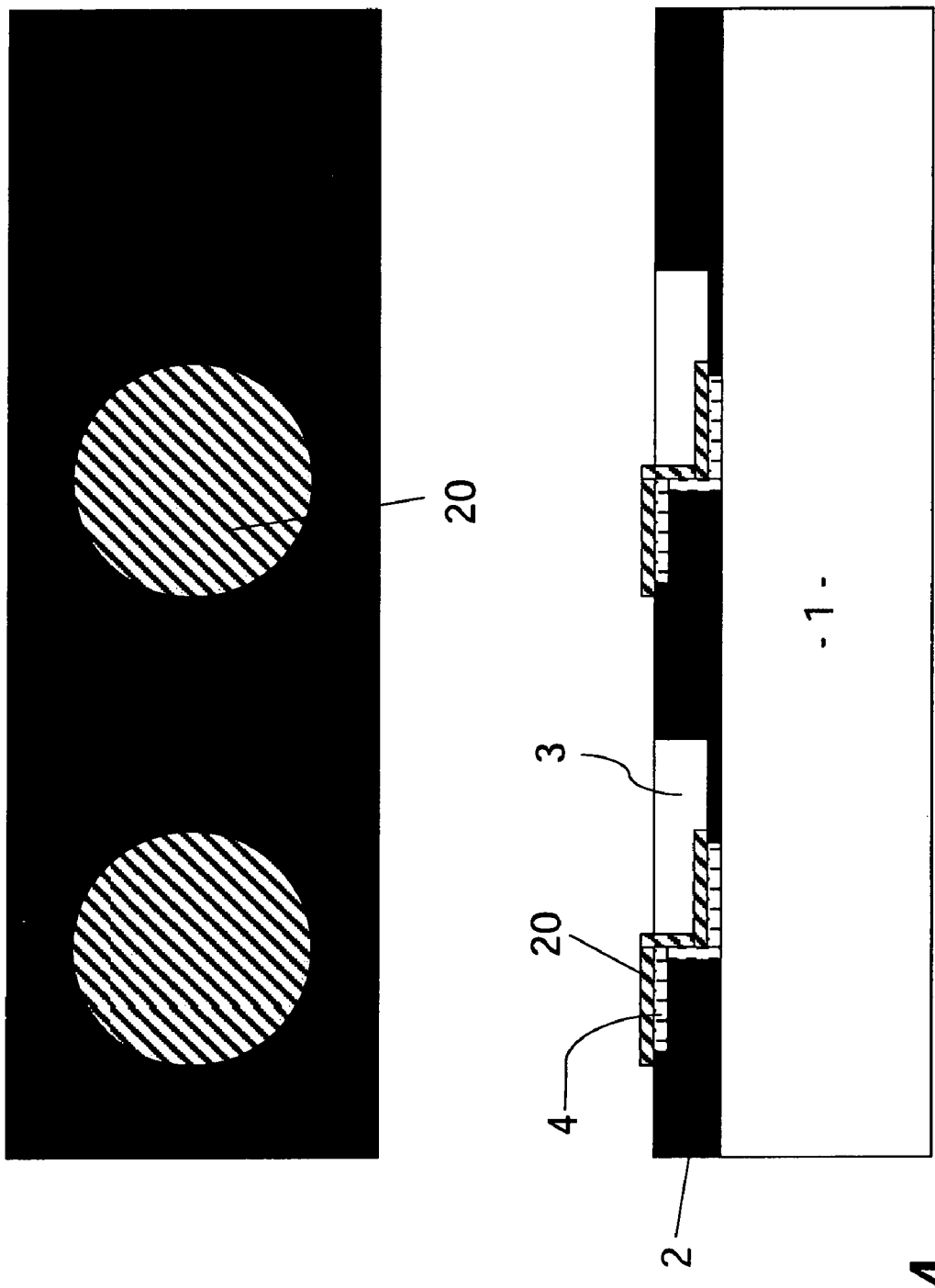

In the exemplary embodiment shown here, second sacrificial layer 4 is structured by thermal oxidation. To this end, second sacrificial layer 4 is completely oxidized to a higher valency up to the regions covered by passivating layer 20, as shown in FIG. 14. At this point it should be mentioned that other methods of structuring the second sacrificial layer may be used as well.

Figure 15:
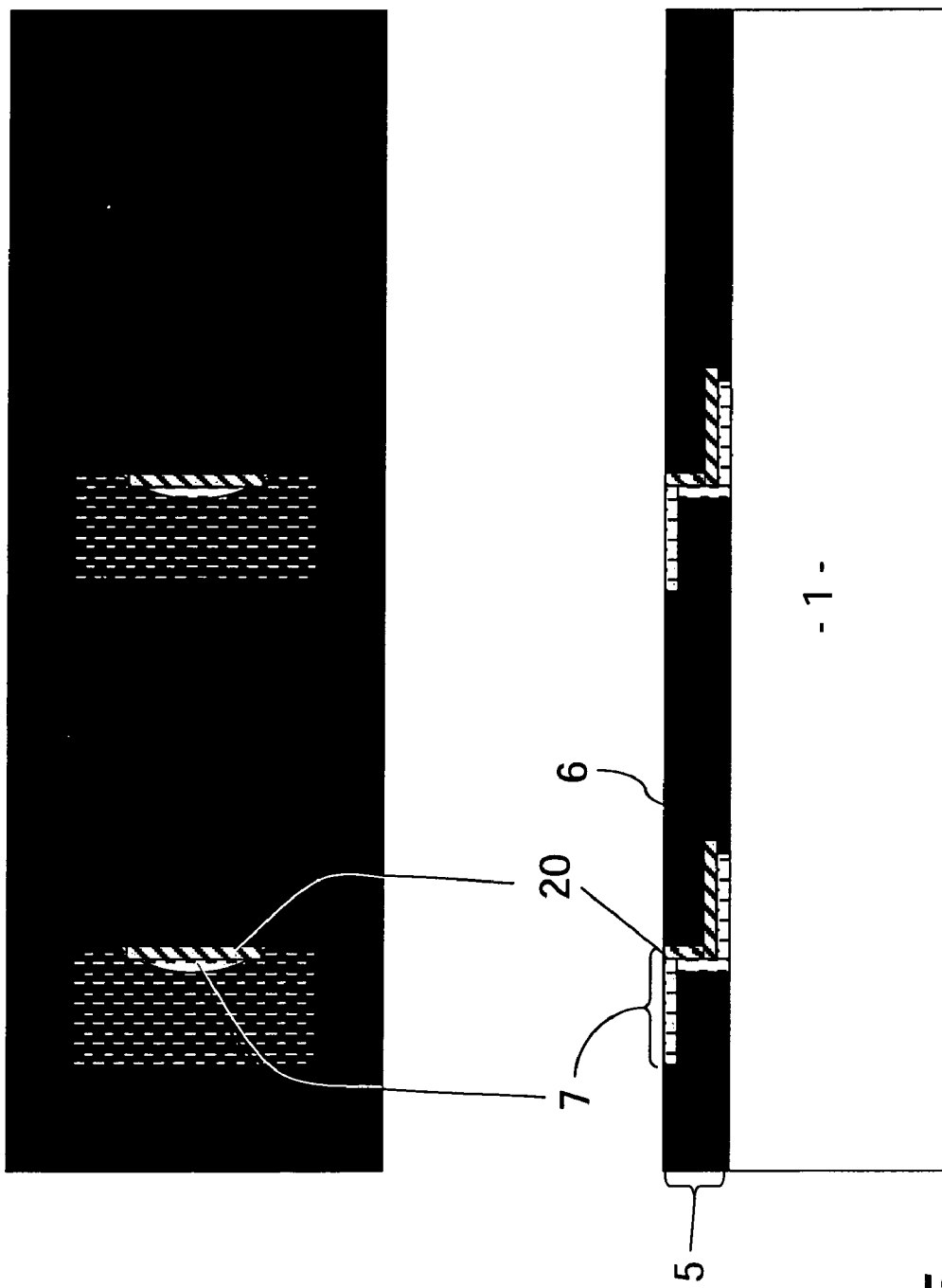

Above structured second sacrificial layer 4, which is covered by structured passivating layer 20, a preferably dielectric upper layer 6 or a corresponding layer system is now deposited, for example TEOS oxides, spin-on glasses, polymides etc, a smoothing behavior in the deposition having a positive effect. This layer structure is then thinned until the region of second sacrificial layer 4 situated on lower layer 2 is exposed. FIG. 15, which shows the layer structure following thinning, clearly illustrates that the parts of second sacrificial layer 4 deposited on the edges of openings 3 create a direct, i.e. essentially vertical, connection between the substrate surface and the surface of the layer structure.

Figure 16:
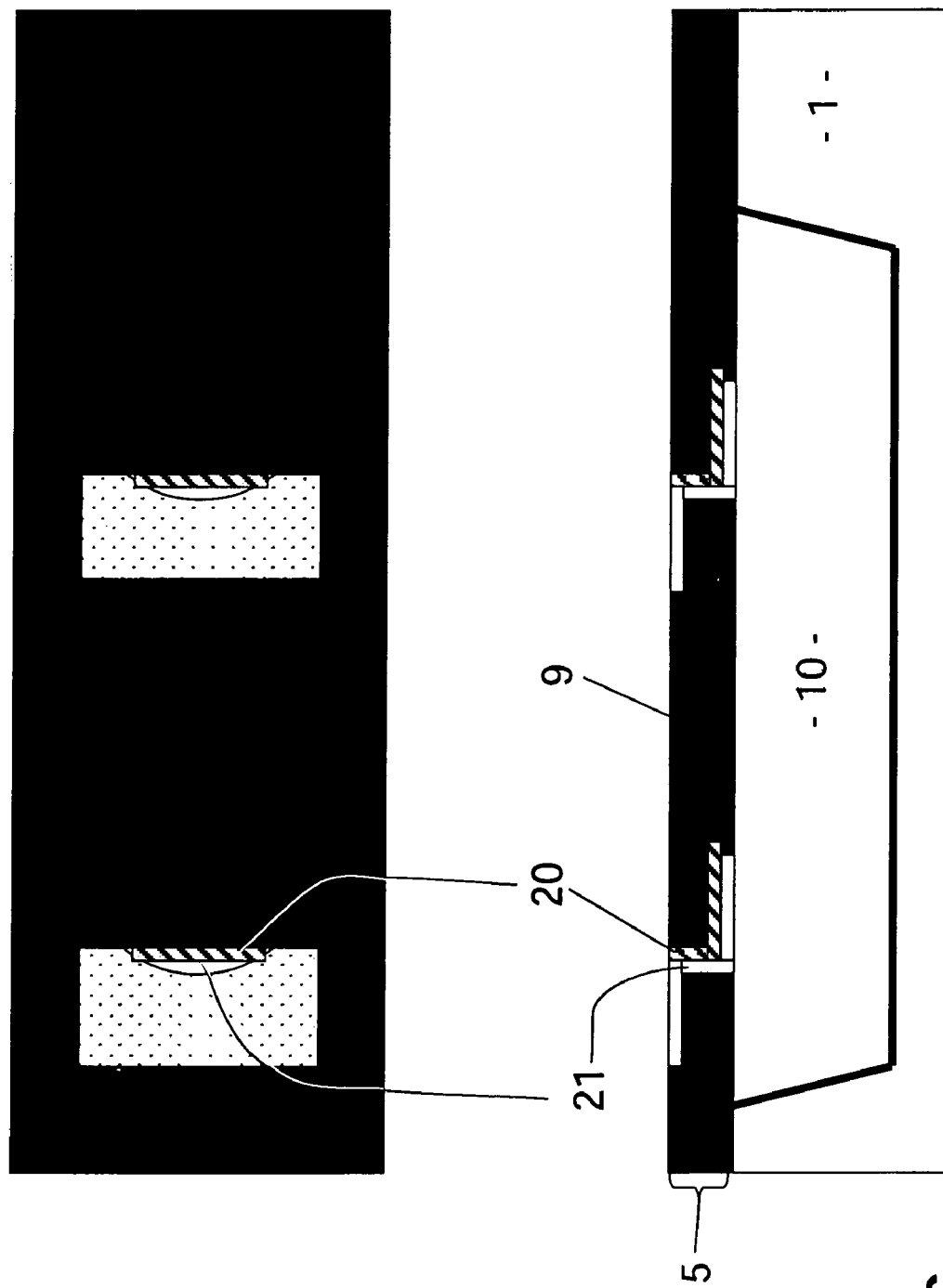

FIG. 16 shows the layer structure following a vapor phase etching step, for example using $ClF_3$, $XeF_2$ etc., in which initially second sacrificial layer 4 was removed. A vertical access channel 21 resulted in the process, via which it was then possible to deliver the etch attack on substrate 1. In this manner, a cavity 10 was produced in the substrate, thus exposing diaphragm 9. It is important that the lateral dimensions, i.e. the diameter or the cross-sectional area, of access channel 21 are determined by the layer thickness of second sacrificial layer 4 in the edge region of openings 3 and not by structuring a masking layer. Accordingly, the lateral dimensions are here also not limited by the resolution of the lithography method, i.e. the minimal structure width of the lithography. For this reason, the access channels may be dimensioned in such a way that a gaseous etching medium is able to penetrate unhindered, while the penetration of liquids, depending on the surface tension, is largely prevented. Such access channels normally have a diameter of up to 200 nm.

The perforated, self-supporting diaphragm 9 described above may be processed further using known methods. FIG. 17 shows such a membrane 9, which has been provided with openings 22. Cavity 10 here acts as a liquid channel and openings 22 are used as access for the liquid. Via access channels 21, which are not closed, gases dissolved in the liquid may escape without the liquid being able to escape as well via these access channels 21.

Figure 18:
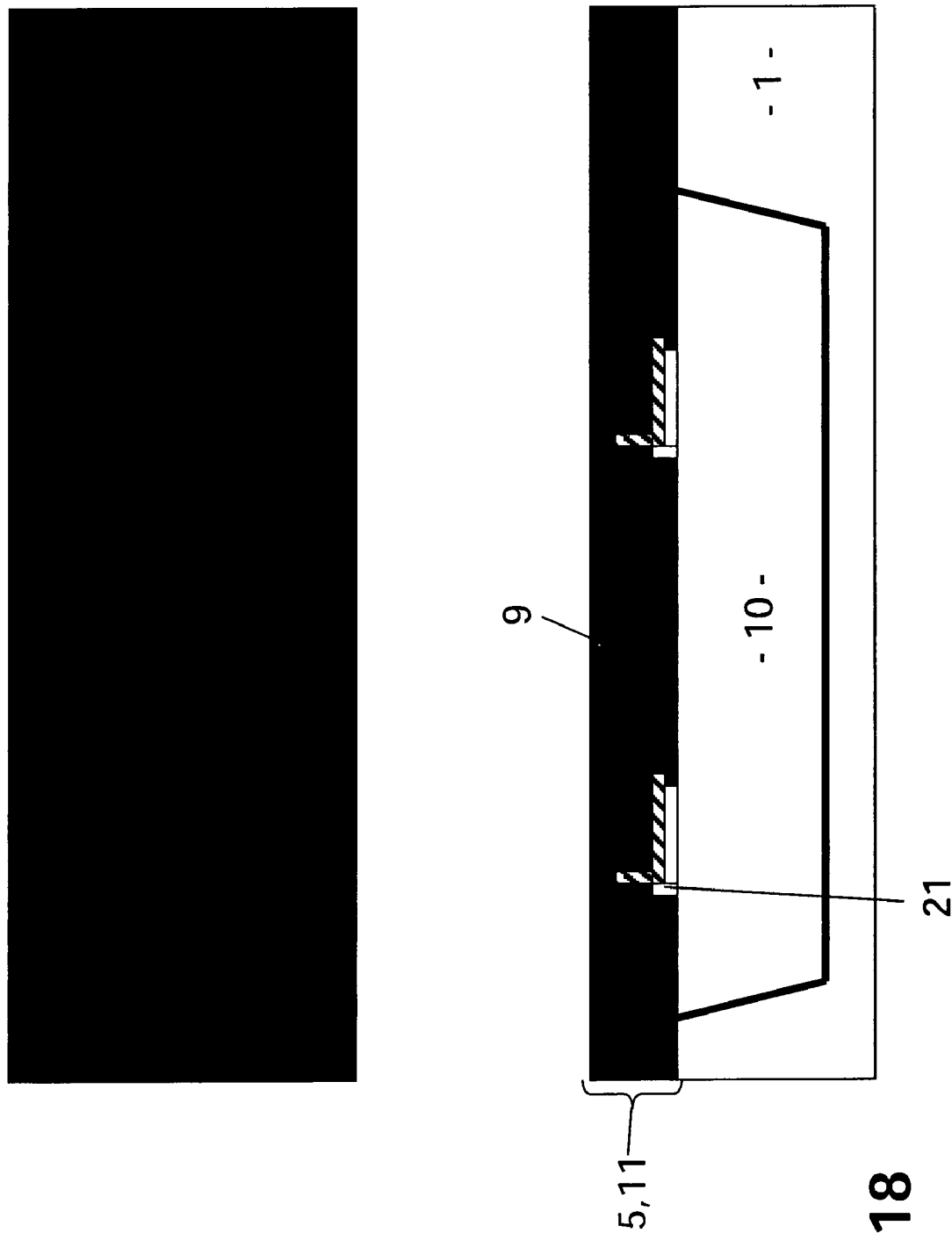

Another possibility for the further processing of the component represented in FIG. 16 is shown in FIG. 18. Here, access channels 21 were closed by deposition over the entire surface, for example, of PECVD oxide. Due to the small dimensions of access channels 21, only a small layer thickness is required for this purpose. The pressure set during deposition may be used as a reference pressure and increase the thermal insulation. A further processing including lithography is possible here as well.

Finally, in combination with FIG. 19, another possibility is shown for improving the adjustment of the endpoint in the thinning of the layer structure—which was previously described in connection with FIG. 15. For this purpose, in the structuring of second sacrificial layer 4, a larger sacrificial layer region 23 outside of the diaphragm region is produced, which during thinning causes a measurable discoloration of the plasma with the aid of plasma processes. This discoloration may then be used as a stop signal. In the subsequent etching to clear the access channels and cavity 10, sacrificial layer region 23 is completely removed as well.

REFERENCE NUMERALS

1 Substrate—First Sacrificial Layer
2 Lower Layer
3 Opening (Lower Layer)
4 Second Sacrificial Layer
5 Layer System
6 Upper Layer
7 Opening (Upper Layer)
8 Access Channel
9 Diaphragm
10 Cavity
11 Closing Layer
12 First Leg—Thermopile
13 Opening—Contact
14 Second Leg—Thermopile
15 Opening—Bondlands
16 Passivating Layer
17 Metal Track
18 Passivating Layer
19 Access Channel (FIG. 16)
20 Opening (FIG. 17)
21 Sacrificial Layer Area (FIG. 19)

What is claimed is:

1. A micromechanical component having a component structure implemented in a layered design, comprising:
   at least one diaphragm;
   at least one first sacrificial layer and a layer system situated above the first sacrificial layer, a cavity being formed in the first sacrificial layer below the diaphragm; and
   at least one access channel to the cavity, in a region of the diaphragm between an upper layer and a lower layer of the layer system situated directly above the first sacrificial layer, the at least one access channel having at least one opening in the upper layer and at least one opening in the lower layer, the opening in the upper layer and the opening in the lower layer being offset with respect to one another, wherein a portion of the access channel lying along the offset is arranged to prevent contaminant particles of at least 200 nm from entering the cavity.

2. The component according to claim 1, wherein the opening in the upper layer and the opening in the lower layer do not overlap such that the access channel has an offset.

3. The component according to claim 1, further comprising a second sacrificial layer, and wherein the opening in the upper layer and the opening in the lower layer overlap at most in an order of magnitude of a layer thickness of the second sacrificial layer.

4. The component according to claim 1, wherein the access channel is closed off, and a defined pressure, between vacuum and atmospheric pressure, is established in the cavity.

5. The component according to claim 1, wherein the access channel is closed off by at least one of (a) filling the opening in the upper layer of the layer system and (b) providing at least one closing layer above the layer system.

6. The component according to claim 1, wherein the first sacrificial layer is composed of one of amorphous silicon, polycrystalline silicon, monocrystalline silicon, silicon-germanium, and germanium, and at least one of the upper layer and the lower layer of the layer system is composed of at least one of $SiO2$ and $Si3N4$ layers.

7. The component according to claim 1, wherein the component is used in one of:
   pressure sensors,
   fluid mass flow sensors,
   thermal acceleration sensors,
   thermal yaw-rate sensors,
   thermal angle-of-inclination sensors,
   adiabatic gas heat dissipation sensors, for H2 sensors and side impact sensors,
   thermal chemical sensors,
   thermal heating plate applications,
   highly dynamic temperature sensors,
   atmospheric humidity sensors,
   infrared detectors, in one of gas sensors and infrared cameras,
   thermopiles,
   microfluidic channels, and
   HF applications.

8. The component according to claim 1, wherein a diameter of the access channel portion is less than 200 nanometers.

* * * * *